United States Patent
Polney

(10) Patent No.: US 6,504,359 B2
(45) Date of Patent: Jan. 7, 2003

(54) METHOD AND DEVICE FOR TESTING ELECTRONIC COMPONENTS

(75) Inventor: Jens Polney, Münich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/768,393

(22) Filed: Jan. 24, 2001

(65) Prior Publication Data

US 2001/0019277 A1 Sep. 6, 2001

(30) Foreign Application Priority Data

Jan. 24, 2000 (DE) .......................... 100 02 831

(51) Int. Cl.$^7$ .................. G01R 31/26; G01R 31/28
(52) U.S. Cl. .................... 324/158.1; 324/765
(58) Field of Search ................ 324/765, 158.1; 714/726, 727

(56) References Cited

U.S. PATENT DOCUMENTS 5,386,189 A * 1/1995 Nishimura et al. ...... 324/158.1
5,387,862 A * 2/1995 Parker et al. ............ 324/158.1
5,960,008 A * 9/1999 Osawa et al. ............... 714/726
6,032,227 A * 2/2000 Parvathala et al. ......... 714/726

FOREIGN PATENT DOCUMENTS

EP 0 558 231 A2 9/1993

OTHER PUBLICATIONS

Messmer: "Peripherie– und Support–Chips", PC–Hardwarebuch 1993, ISBN 3–89319–528–9, pp. 376 to 385.

* cited by examiner

Primary Examiner—Michael Sherry
Assistant Examiner—Paresh Patel
(74) Attorney, Agent, or Firm—Laurence A. Greenberg; Werner H. Stemer; Gregory L. Mayback

(57) ABSTRACT

A method for testing electronic components includes the step of outputting test output data for the tested electronic components on a test board without activating individual scan lines or individual scan signals. Starting from a first activated electronic component successively the following electronic components are activated one after another by passing an activation signal from electronic component to electronic component. A device for testing electronic components is also provided.

24 Claims, 4 Drawing Sheets

METHOD AND DEVICE FOR TESTING ELECTRONIC COMPONENTS

BACKGROUND OF THE INVENTION

Field of the Invention

The invention relates to a method and a device for testing a plurality of electronic components.

When electronic components, in particular semiconductor modules, chips or the like, are manufactured, it is necessary for the quality assurance of the production to test and evaluate the manufactured electronic components both in terms of their basic method of operation and freedom from faults and with respect to concealed quality differences. For this purpose, particularly within the scope of mass production of electronic components, the components are subjected to joint hardware and/or software testing methods. When this is done, the electronic components are also to be subjected to specific environmental conditions within the scope of the test which is to be carried out, such as raised temperature, overvoltage or the like. The tests, in particular under the specific environmental conditions, are carried out for a specific predefined time period. As a result of the test which is carried out it is possible not only to eliminate electronic components which have failed or which do not comply with specific specifications, but also, by virtue of the test result, it may, under certain circumstances, be possible to arrive at statistical conclusions relating to the entirety of the production.

In known test methods for testing a plurality of electronic components, in particular semiconductor modules, chips or the like, at least one test is carried out on a plurality of electronic components. After the respective tests are completed, the electronic components are made to output output data which relate to the test or the test result, and these output data are then recorded and fed to further processing devices for evaluating the test.

In order to do this, a plurality of electronic components are usually provided on a device for testing, and the test or tests are then carried out. The outputting of the output data by the individual, tested electronic component is usually brought about by feeding an output initiation signal to each component provided on the device through the use of an individual line provided for this component, the output initiation signal causing the addressed component to output, after the test carried out on it has been completed, the output data which relate to the test or test result on a perspective output line from where the output data are then recorded or tapped for further processing.

It is customary here that a common line device, for example a bus or the like, is provided for outputting the output data for a plurality of electronic components. Consequently, the individual electronic components must be made to output their output data in such a way that a data collision on the common bus is avoided.

Particularly within the scope of mass production it is necessary for a common test device to be equipped simultaneously with the largest possible number of electronic components in order to keep the efficiency of the test method with respect to yield and time period as high as possible, as is usually already also provided when the respective electronic components are produced.

In known methods and devices, the electronic components which are to be tested with respect to the initiation of the outputting of the output data are, however, each addressed individually via a separate line using a separate output initiation signal, with the result that the testing capacity of respective test devices or test boards is as a rule limited by the plurality of individual lines which have to be provided to make available the output initiation signals because these lines take up a considerable amount of space on a test board and consequently constitute a basic obstacle to further increasing the capacity.

It is to be borne in mind here, in particular, that the tester is basically limited in terms of channels. This means that only a limited number of I/O channels or input/output channels is available. The more scan signals or chip select signals are necessary, the more I/O channels are allocated to or seized by the tester. This is also a factor which could limit the maximum number of electronic components on a test board.

SUMMARY OF THE INVENTION

It is accordingly an object of the invention to provide a method and a device for testing a plurality of electronic components which overcome the above-mentioned disadvantages of the heretofore-known methods and devices of this general type and which can be implemented for a particularly high capacity and at the same time a high level of reliability.

With the foregoing and other objects in view there is provided, in accordance with the invention, a method for testing semiconductor components, in particular semiconductor modules, chips or the like, the method includes the steps of:

carrying out at least one test of a plurality of electronic components;

causing the electronic components to output output data relating to a respective test result;

recording the output data which are output by the electronic components;

starting the recording of the output data by feeding a primary output initiation signal to a first one of the electronic components in order to cause the first one of the electronic components to output a first portion of the output data; and continuing the recording of the output data for further ones of the electronic components by feeding a respective output initiation signal, which is not directly dependent on the primary output initiation signal and corresponds to a status signal of a preceding one of the electronic components, to a following one of the electronic components in order to induce the following one of the electronic components to output a further portion of the output data, such that the output data of the electronic components is recorded, in response to the primary output initiation signal, until the output data of all the electronic components are output and recorded.

In other words, the method according to the invention, includes the following steps:

at least one test of the electronic components is carried out, the electronic components are made to output data relating to a respective test result, the output data which are output by the electronic components are recorded such that the recording of the output data is begun by feeding a primary output initiation signal to a first one of the electronic components in order to cause its output data to be output, and such that the recording of the output data is continued for the further electronic components by feeding in each case one output initiation signal, which is not directly dependent on the primary output initiation signal and corresponds to a status signal of a preceding electronic component, to each following electronic component in order to initiate the outputting of its output data, with the result that the output data of the plurality of the electronic components is recorded in response to the primary output initiation signal until the output data of all of the electronic components are output and recorded.

In the method according to the invention for testing a plurality of electronic components, in particular semiconductor modules, chips or the like, provision is made for the recording of output data to be begun by feeding a primary output initiation signal to a first electronic component of the plurality of electronic components in order to bring about the outputting of its output data. For the further electronic components the recording of the respective output data is continued by in each case feeding an output initiation signal corresponding to a status signal of a preceding electronic component to each following electronic component in order to initiate the outputting of its output data. Here, according to the invention the recording of the output data of the plurality of electronic components is carried out in response to the primary output initiation signal until the output data of the entirety of the plurality of electronic components have been output and recorded.

A basic idea of the method according to the invention is thus to record the output data by causing a first electronic component of the plurality of electronic components to begin to output its output data. This is effected in that a primary or first output initiation signal is fed to this first electronic component, in response to the reception of which signal this addressed first electronic component starts to output its output data.

The following further electronic components are read out according to the invention in that an output initiation signal is also fed to each of them in order to initiate the outputting of the respective output data. It is also a basic idea of the method according to the invention that the respective output initiation signal for the further following electronic components corresponds in each case to a status signal of a preceding electronic component, and is not made available centrally as is the case with conventional methods.

This may advantageously be in each case the respective status signal of a preceding electronic component, which specifies that, on the one hand, the test which is to be carried out on the preceding component has been concluded and/or that the data of the preceding component which are to be output have already been output, with the result that no collision may occur on the respective bus or line system.

The outputting of the output data is carried out until the output data of the entirety of the plurality of electronic components has been output in response to the primary output initiation signal for the first electronic component, and the respective output data of the plurality of electronic components have been output, and thus recorded.

In a preferred embodiment of the method according to the invention, the outputting of the output data for the plurality of electronic components, in particular for the following electronic components for each electronic component, is brought about individually and successively. This ensures that collisions between the output data of different components do not occur during the outputting, and consequently on the line device or on the bus for recording the output data of the electronic components, because just a single electronic component is made to output its output data.

It is particularly advantageous here if the recording of the output data is continued for the further electronic components by individually and successively feeding in each case one output initiation signal corresponding to a status signal of the specific directly preceding electronic component to each specific following electronic component in order to initiate or bring about the outputting of its output data. This in particular ensures that the output data of the plurality of electronic components are recorded in response to the primary output initiation signal until the output data of the entirety of the plurality of electronic components are output and recorded individually and successively. This procedure also ensures that no collisions whatsoever occur during the outputting of the output data.

In terms of controlling the timing of the initiation or bringing about of the outputting of the output data it is particularly advantageous if the signal used as status signal is in each case one which represents the conclusion of the outputting of the output data of the—in particular directly—preceding electronic component because superimposition of output data from various electronic components is then avoided.

Under certain circumstances, various tests or various test sections are to be carried out successively on the electronic components. When this is the case, the individual test results from successive tests can then also be respectively read out after the conclusion of a section or test. It is particularly advantageous here if an initiation signal corresponding to a status signal of the last electronic component is used to bring about a further test, test section or the like for the plurality of electronic components. This makes it possible to determine directly the conclusion of the outputting of data by the last electronic component, and consequently immediately start a further test, test section or the like so that time delays are avoided.

For carrying out both the testing of the electronic components and the outputting and recording of the output data of the electronic components it is particularly advantageous if a clock signal is used as the basis for the initiation of the outputting and/or for the outputting of the output data themselves. Such a clock signal is as a rule customary in any case in all the processing steps so that a clock signal which is already available can also be used for the initiation of the outputting and/or for the outputting of the output data themselves.

A device for testing a plurality of electronic components, in particular semiconductor modules, chips or the like, is configured to carry out at least one of the tests to be carried out on the electronic component and to record that output data which are output by the electronic components, and is used in particular to perform the method according to the invention.

Therefore, with the objects of the invention in view there is also provided, a device for testing a plurality of electronic components, including:

a testing configuration for performing at least one test to be carried out on a plurality of electronic components, the testing configuration including a first line device and further line devices;

the first line device to be connected to a first one of the electronic components and providing a primary output initiation signal to the first one of the electronic components for causing the first one of the electronic component to output first output data; and the further line devices being provided for further ones of the electronic components, each of the further line devices supplying, to a respective following one of the electronic components, an output initiation signal, which is not directly dependent on the primary output initiation signal and corresponds to a status signal of a preceding one of the electronic components, for causing the following one of the electronic components to output further output data such that output data of all of the electronic components is output to be recorded in response to the primary output initiation signal provided from the first line device.

In other words, the device according to the invention for testing a plurality of electronic components, in particular semiconductor modules, chips or the like, in particular according to the method of the invention, is configured to perform at least one test which is to be carried out on the electronic components, and to record output data which have been output by the electronic components and which relate to a respective test result, wherein a first line device is provided through the use of which a primary output initiation signal can be fed to a first electronic component of the plurality of electronic components in order to bring about the outputting of its output data, and wherein a line device is provided for the further electronic components for each following electronic component, through the use of which line device in each case an output initiation signal corresponding to a status signal of a preceding electronic component can be fed to the following electronic component in order to bring about the outputting of its output data, with the result that the output data of the entire plurality of electronic components can be output and are recorded in response to the primary output initiation signal at the first line device. The electronic components are to be understood as workpieces to be tested and are not claimed elements of the device according to the invention.

The device according to the invention provides a first line device through the use of which a primary output initiation signal can be fed to a first electronic component of the plurality of electronic components in order to bring about the outputting of its output data. In addition, for the further electronic components for each following electronic component a line device is provided through the use of which an output initiation signal corresponding to a status signal of a preceding electronic component can be fed to the following electronic component in order to bring about the outputting of its output data. As a result, the invention enables the output data of the entirety of the plurality of electronic components to be output and recorded in response to the primary output initiation signal on the first line device.

A basic idea of the device according to the invention is that, in contrast to the plurality of chip select lines or scan signal lines in the prior art, now just a single external line device is provided, with which line device the process of the outputting of the output data for a first—in particular predefined—component is carried out. The further and following electronic components are then caused to output their respective output data through the use of internal line devices, specifically through the use of respective output initiation signals which are fed to a respective following component through the use of a line device provided specifically for this component, the respective output initiation signal corresponding to a status signal of a preceding component and being derived, under certain circumstances, from this status signal. Of course, the status signal itself can also be used as an output initiation signal for a following electronic component.

The invention thus ensures that all the output data of the entirety of the plurality of electronic components can be output and recorded in response to a single primary output initiation signal, to be specific on the first line device. This means that the plurality of conventional chip select lines or scan select lines is obsolete. As a result, space is saved on the respective devices for testing because the respective external lines are eliminated and the number of electronic components to be tested on a respective device is ultimately restricted by the space requirements of the electronic components themselves and by the signal losses, which occur under certain circumstances, on the internal lines.

Furthermore, the invention also ensures that the limiting of the tester in terms of the I/O channels which can be addressed does not constitute an actual limitation on the number of electronic components which can be tested because, according to the invention, just a single I/O channel is seized with one scan signal, to be specific with the primary initiation signal, through the use of which the outputting of the output data of a first electronic component is brought about.

In an advantageous development of the method according to the invention there is provision for just one line device to be provided for each specific following electronic component, through the use of which line device in each case an output initiation signal corresponding to a status signal of the respective specific directly preceding electronic element can be fed to the specific following electronic component in order to bring about the outputting of its output data, and that, as a result, the output data of the entirety of the plurality of electronic components can be output and recorded individually and successively in response to the primary output initiation signal on the first line.

A core idea of this embodiment of the device according to the invention is that the plurality of electronic components are each successively separately connected to one another in serial fashion with just one line device so that, starting from a predefined first electronic component, the following electronic components are individually caused to output the output data through the use of the respectively provided individual line devices. Thus, on the basis of the formation of the individual line devices, it is precisely determined in a predefined way which specific electronic component from among the plurality of electronic components will be used to cause a specific following electronic component to output the output data. The sequence in which the bringing about of the outputting of the output data is thus determined in its entirety on the basis of the circuit configuration of the respective line devices so that the output data of the entirety of the plurality of electronic components can be output and recorded individually and successively in response to the first and primary output initiation signal on the first line device for the predefined first electronic component.

The device for testing a plurality of electronic components can be configured so as to be particularly simple and well structured if an accommodation device is provided which is configured to place the electronic components on the device for testing the plurality of electronic components and make contact with the electronic components on the device for testing the plurality of electronic components.

Furthermore, according to the invention a control device is provided which is configured at least to control the test which is to be carried out on the electronic components. In addition, the control device is configured also to generate and/or to output the primary output initiation signal to the first line device. To do this, the control device must be electrically connected in particular to the first line device for the predefined, first electronic component.

In order to evaluate and/or also to control the tests to be carried out, an evaluation device is also provided which is configured at least to record the output data output by the electronic components.

It is also advantageous if a line device is provided through the use of which at least a clock signal which is made available can be fed at least to the electronic components in order to control the outputting of the output data. Generally, in a device for testing electronic components, it is already standard practice to provide a clock device through the use of which the tests and test sections are also processed in clocked form. Consequently, it does not require any particular effort, but rather constitutes a simplification, if the clock signal which is already provided is also fed to the electronic components via an appropriately embodied line device in order to bring about the outputting of the respective output data in a clocked form in response to the respective output initiation signals.

In order to carry out a plurality of successive tests or test sections, a line device is advantageously provided through the use of which an initiation signal which corresponds to a status signal of the last electronic component can be made available and/or fed to the control device in order to bring about a further test, test section or the like for the plurality of electronic components. This ensures that, directly after the conclusion of the outputting of the output data of the last electronic component to be addressed, a further test or test section can be initiated without a time delay.

A particularly simple way of implementing the successive initiation of the successive electronic components is obtained in a preferred embodiment of the device according to the invention by providing a flip-flop device for each successive electronic component, which flip-flop device can be provided with the status signal of the—in particular directly—preceding electronic component, in particular to generate the respective following output initiation signal. By inserting or interconnecting the flip-flop devices it is possible to generate, independently of the form of the respective status signals, an output signal which is standardized in a specific way and which can then be suitably used as an output initiation signal.

Here, it is also advantageous if the flip-flop device is embodied in each case in the line device of the respective following electronic component. If this respective line device is substantially located on the accommodation device of the device for testing, it is advantageous if the respective flip-flop devices are also embodied on the accommodation device—for example on the circuit board of the test board. On the other hand, the respective flip-flop devices may already also be provided in the actual electronic components to be tested.

The flip-flop devices, formed in this way, of the plurality of successive electronic components advantageously form a shift register in which the activated state is thus passed on successively and individually from the first electronic component to the following electronic components via the respective flip-flop devices and the line devices in response to the primary initiation signal until all the electronic components have been successively activated and output their output data.

The invention thus permits, both in method terms and device terms, the activation of electronic components to be tested in terms of the output of the output data after a test has been carried out without additional scan line or chip select lines having to be provided in the device—for example a test board. In method terms this means that only the first electronic component has to be actually caused to output its output data, while all the following electronic components are addressed inherently by the method according to the invention, individually and successively one after another.

As a result of the method and device according to the invention, the maximum addressable number of electronic components is no longer restricted by the scan lines or chip select lines which are necessary in the prior art, but rather is now restricted essentially only by the size of the electronic components themselves and also by the respective losses on the lines.

The tests themselves can be carried out serially or in parallel through the use of an appropriate clock and/or a test initiation signal. The output data are read out after the conclusion of the tests—as has already been described above—in a serial fashion in order to avoid collisions on the data lines. As a result of the device and method according to the invention, just one serial input pin and one serial output pin and a corresponding clock pin are now required for the electronic components to be tested. As a result, the number of addressable electronic components on the device or the test board becomes independent of the number of scan lines or chip select lines which have to be provided conventionally.

The method and device according to the invention can be applied in the same way with all chip generations. There is basically no need for adaptation for new chip generations.

Although the additional flip-flops which are to be provided can be embodied between the serial output pin and the serial input pin of successive electronic components in the device, it is possible, for example, also to provide respective flip-flops internally in the components, in particular for future chip generations.

In specific electronic components—in particular in the case of DRDRAMs (Direct Rambus DRAM)—serial input pins (SIO0) and serial output pins (SIO1) are frequently already present. In other electronic components, if appropriate pins which are not used in the test have to be appropriately remapped as serial input pins and output pins in order to be able to implement the successive wiring of the plurality of electronic components.

The method and device according to the invention can be applied in particular in component burn-in testing of SDRAMs and DRDRAMs. In such cases it is suitable to test a plurality of identical electronic components simultaneously in numbers of up to several thousands and perform a serial read out, a pulse being applied to the input of a first electronic component or chip, and the pulse then being shifted further in the serial chain by one electronic component or one chip at each available clock period, in order to activate the respective electronic component or chip.

Other features which are considered as characteristic for the invention are set forth in the appended claims.

Although the invention is illustrated and described herein as embodied in a method and device for testing electronic components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
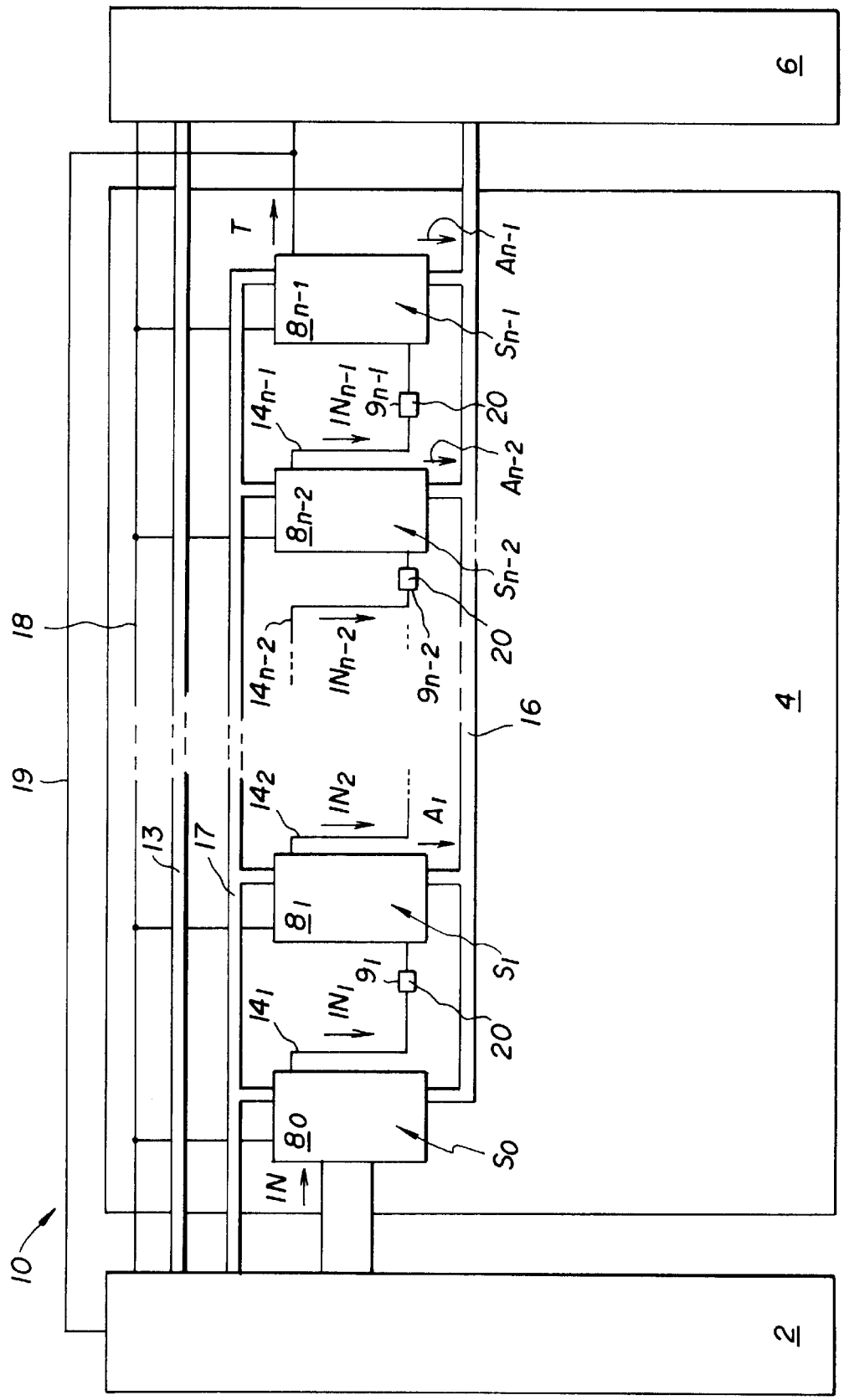
FIG. 1 is a schematic block diagram of a preferred embodiment of the device according to the invention for testing electronic components.

Referring now to the figures of the drawings in detail and first, particularly, to FIG. 1 thereof, there is shown a schematic block diagram of an embodiment of the device according to the invention for testing electronic components. The device 10 is composed essentially of a control device 2 through the use of which the tests which are to be carried out are controlled, an evaluation device 6 through the use of which the tests which are to be carried out are evaluated, and an accommodation device 4 on which the electronic components $8_0, \ldots, 8_{n-1}$ are provided on the device 10, on which the electronic components are secured and on which contact is made with them, the control device 2 and the evaluation device 6 being, if appropriate, connected to a data exchange and control line 13.

Appropriate addresses, data and/or instructions for carrying out the test or tests are simultaneously fed via a bus 17 to the electronic components $8_0, \ldots, 8_{n-1}$ provided on the accommodation device 4. The test sequence and also the outputting of the output data which is to take place later are clocked through the use of a clock signal CLK which is made available on a clock line 18.

After the tests have been concluded, the outputting of the output data of the electronic components $8_0, \ldots, 8_{n-1}$ begins by a primary initiation signal IN being fed to the electronic component $8_0$ from the control device 2 via a single line 12. This initiation signal IN onto the line device 12 causes the output data $A_0$ of the electronic component $8_0$ to be output. The output data $A_0$ are output onto the line device 16, the output bus. There, at this time, only the output data $A_0$ of the first electronic component $8_0$ appear because all the following electronic components $8_1, \ldots, 8_{n-1}$ are inactive in terms of the outputting of data.

When the outputting by the first electronic component $8_0$ has been concluded, its status, and thus also the respective status signal $S_0$, change. This status signal $S_0$ or its change is used to generate an output initiation signal $IN_1$ for the following electronic component $8_1$, which is connected to the first electronic component $8_0$ via the line device $14_1$ and receives the respective output initiation signal $IN_1$ from it.

Because the outputting of the first electronic component $8_0$ has already been concluded and only the following electronic component $8_1$ is active, only the output data $A_1$ of the following electronic component $8_1$ appear on the output bus 16.

When the outputting by the following electronic component $8_1$ has been concluded, its status signal $S_1$ changes, in response to which the respective output initiation signal $IN_2$ is generated on the line $14_2$ for the following electronic component $8_2$.

The output data $A_0, \ldots, A_{n-1}$ of all the electronic components $8_0, \ldots, 8_{n-1}$ are thus successively input, separated from one another, into the output data bus 16 and thus fed to the evaluation device 6.

The status signal $S_{n-1}$ of the last electronic component $8_{n-1}$ changes after the completion of the outputting of the output data $A_{n-1}$, as a result of which a respective initiation signal T can be generated on a further line device 19 and fed to the control device 2, in order, if appropriate, to start a further test or test section.

Figure 2:
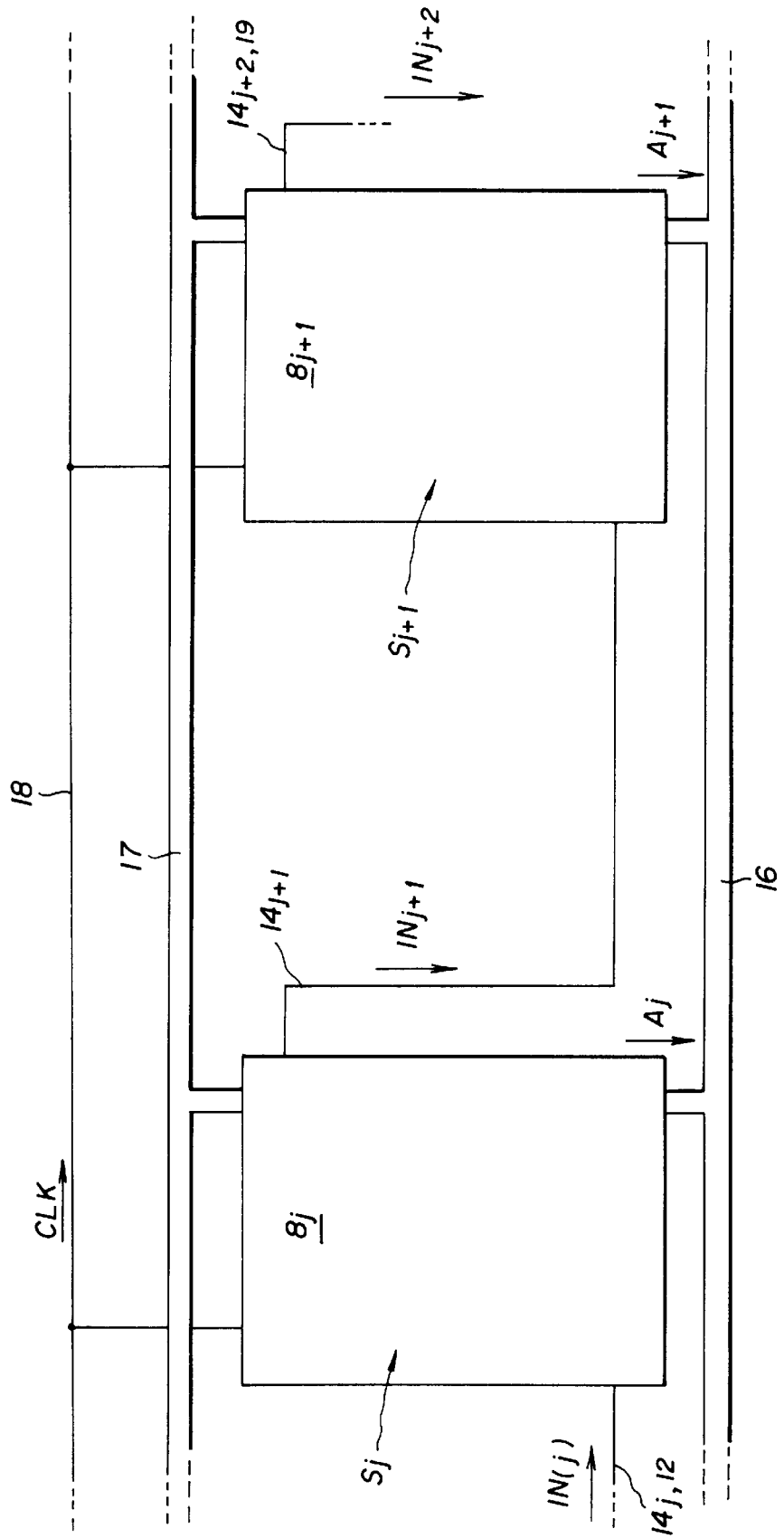
FIG. 2 is a schematic block diagram of a detail of the embodiment of FIG. 1.

FIG. 2 shows a schematic block diagram of a detail of the exemplary embodiment from FIG. 1.

In this detail, a generally directly preceding electronic component $8_j$ and a directly following electronic component $8_{j+1}$ are illustrated, the components $8_j$ and $8_{j+1}$ being connected to the common line device 17 for feeding addresses, instructions and data and to the common data output by 16. At the same time, the two successive electronic components $8_j$ and $8_{j+1}$ receive a common clock signal CLK from the line device 18.

The directly preceding electronic component $8_j$ receives from a line $14_j$—or 12 if it is the first electronic component $8_0$—an output initiation signal $IN_j$—or IN—and the electronic component $8_j$ starts the outputting of its output data $A_j$ to the common data output bus 16.

When the outputting of data via the directly preceding electronic component $8_j$ has been concluded, its status and status signal $S_j$ change, in response to which an output initiation signal $IN_{j+1}$ appears on the line $14_{j+1}$ and is fed to the directly following electronic component $8_{j+1}$, in response to which the latter starts to output its output data $A_{j+1}$ to the common data output bus 16. After the outputting of the data by the directly following electronic component $8_{j+1}$ has been concluded, its status and status signal $S_{j+1}$ change, in response to which an output initiation signal $IN_{j+2}$—or the initiation signal T—is output on the line $14_{j+2}$—or 19 if it is the last electronic component $8_{n-1}$—and the directly following electronic component $8_{j+1}$ is deactivated.

Figure 3:
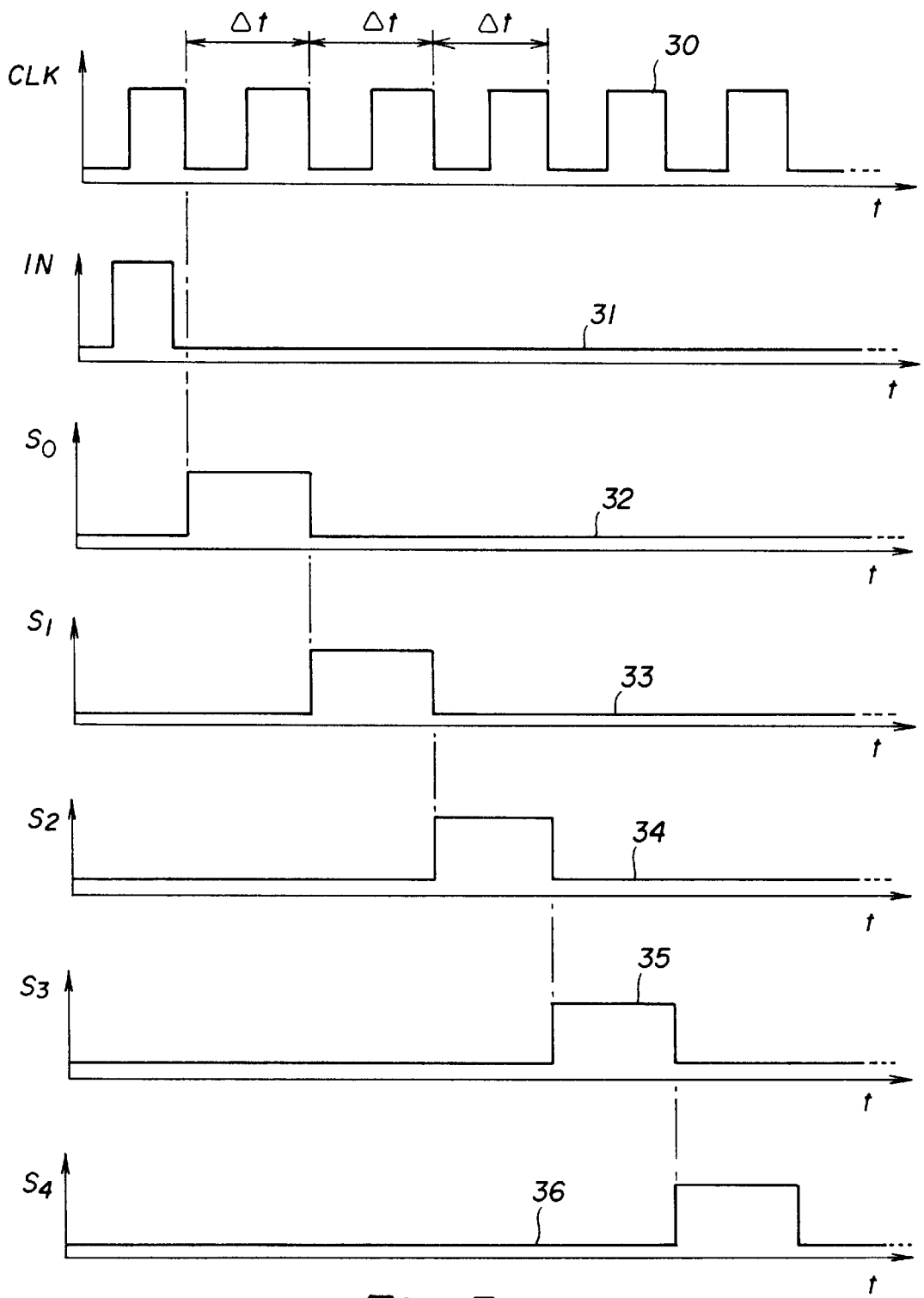
FIG. 3 is a schematic time sequence diagram for an embodiment of the method according to the invention for testing electronic components.

FIG. 3 shows in schematic form a timing diagram for the method according to the invention for testing electronic components for the case in which five elements are tested. Here, the reference symbols 30 to 36 respectively designate the variation over time of specific signals.

Line 30 shows the variation over time of the clock signal CLK, which is made available on the clock signal line. Clock pulses CLK are emitted with a predefined time period at time intervals of $\Delta T$. This clock signal 30 serves as a basis both for the test and for the outputting and evaluation of the tests.

Line 31 shows the variation over time of the primary initiation signal IN which is made available to the first electronic component $8_0$ on the line 12 after the tests have been concluded and the output data are to be read out. Just after reception of the individual pulse (illustrated on line 31) of the primary initiation signal IN, the first electronic component $8_0$ is activated, which is represented by a respective status signal $S_0$ on line 32. During its activated phase, the first electronic component $8_0$ outputs its output data $A_0$ onto the common data output bus 16.

The variation over time of the lines 32 to 36 which represent the status signals $S_0$ to $S_4$ of the electronic components $8_0$ to $8_4$ show clearly that in each case just one electronic component is activated, and thus only the output data of a single electronic component ever appear on the common data output bus 16.

When the outputting of data by the first electronic component $8_0$ has been concluded, the status of this component becomes deactivated and the status signal $S_0$ is reset, as a result of which the following electronic component $8_1$, the variation over time of whose status signal $S_1$ is represented on the line 33, is activated.

After the outputting by the electronic component $8_1$ has been concluded, its status also becomes deactivated and the corresponding status signal $S_1$ is reset, as a result of which the following electronic component $8_2$ is activated with respect to the outputting of the output data.

In this way, all the electronic components $8_0$ to $8_4$ of this exemplary embodiment are successively activated separately from one another, with the result that in each case output data of just a single electronic component appear on the common data output bus.

Figure 4:
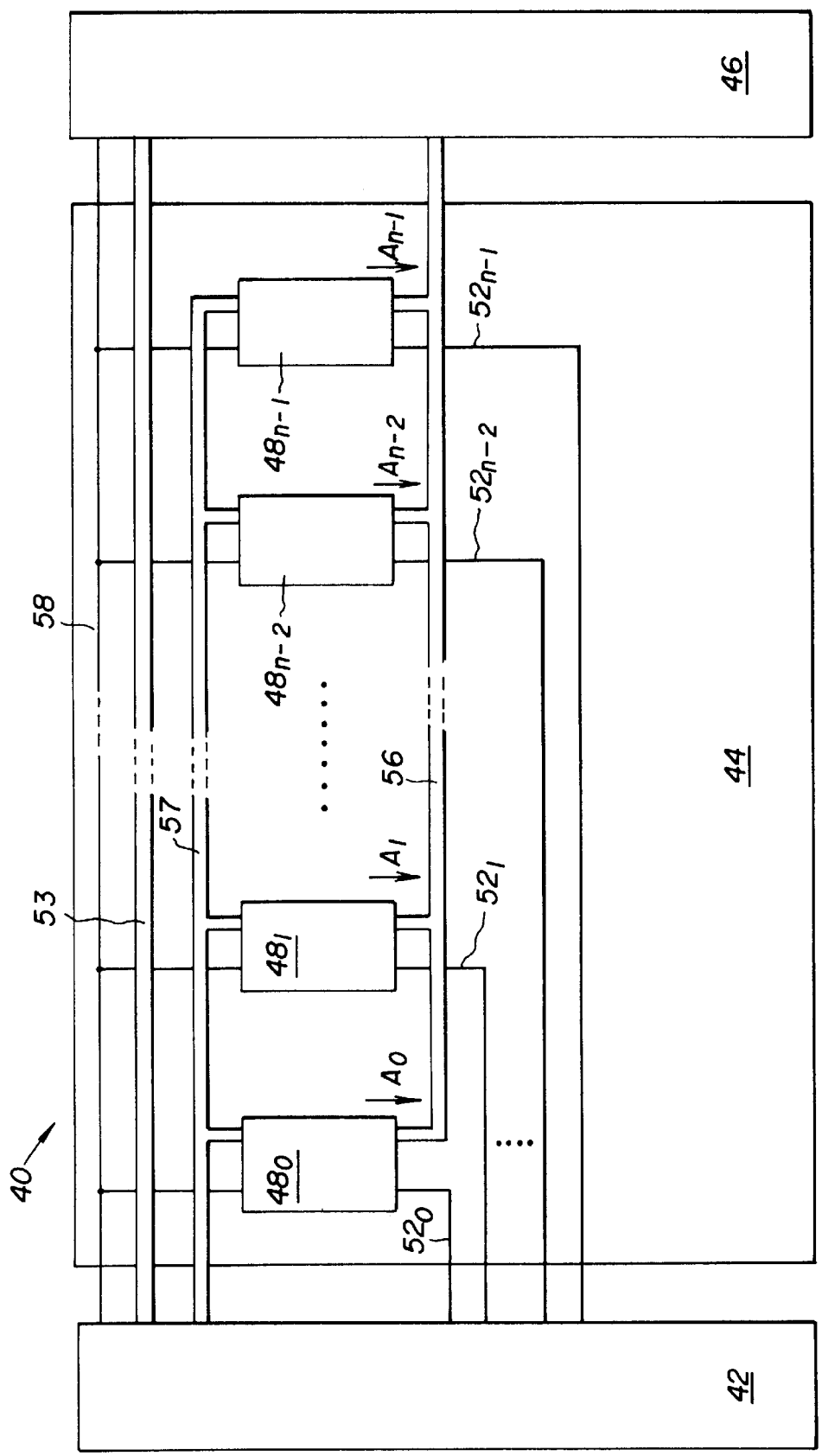
FIG. 4 is a schematic block diagram of a device for testing electronic components according to the prior art.

FIG. 4 shows a schematic block diagram of a device for testing electronic components from the prior art.

This conventional device 40 also has a control device 42 which is connected to a respective evaluation device 46 via a data exchange and control bus 53. In the conventional device 40 also, an accommodation device 44 is provided on which a plurality of electronic components $48_0$ to $48_{n-1}$ are provided. The electronic components $48_0$ to $48_{n-1}$ receive data, addresses and instructions via a common bus 57 in order to carry out the tests. In addition, a clock line 58 is provided, and the electronic components $48_0$ to $48_{n-1}$ are connected to one another and to the evaluation device 46 through the use of a common data output bus 56.

In contrast to the device according to the invention, in the conventional device 40 an individual scan signal line or chip select line $52_0$ to $52_{n-1}$ which initiates the outputting of the output data is provided for each individual electronic component $48_0$ to $48_{n-1}$, as a result of which, in contrast to the invention, the yield is limited as a result of a restriction of the maximum number of electronic components to be tested on a board.

I claim:

1. A method for testing a plurality of electronic components, the method which comprises:
    carrying out at least one test of a plurality of electronic components;
    causing the electronic components to output output data relating to a respective test result;
    recording the output data which are output by the electronic components;
    starting the recording of the output data by feeding a primary output initiation signal to a first one of the electronic components in order to cause the first one of the electronic components to output a first portion of the output data; and
    continuing the recording of the output data for further ones of the electronic components by feeding a respective output initiation signal, which is not directly dependent on the primary output initiation signal and corresponds to a status signal of a preceding one of the electronic components, from a directly preceding one of the electronic components to a directly following one of the electronic components in order to induce the following one of the electronic components to output a further portion of the output data, such that the output data of the electronic components is recorded, in response to the primary output initiation signal, until the output data of all the electronic components are output and recorded.

2. The method according to claim 1, which comprises causing the electronic components to output the output data individually one after another.

3. The method according to claim 1, which comprises causing the further ones of the electronic components to output further portions of the output data individually one after another.

4. The method according to claim 1, which comprises continuing the recording of the output data for the further ones of the electronic components by feeding individually, one after another, to each of following ones of the electronic components the respective output initiation signal, which corresponds to the status signal of a directly preceding one of the electronic components, in order to initiate an outputting of further portions of the output data from the following ones of the electronic components.

5. The method according to claim 1, which comprises using, as the status signal, in each case a signal representing a completion of an outputting of output data of one of the electronic components.

6. The method according to claim 1, which comprises using, as the status signal, in each case a signal representing a completion of an outputting of output data of a directly preceding one of the electronic components.

7. The method according to claim 1, which comprises using an initiation signal which corresponds to the status signal of a last one of the electronic components for bringing about a further test for the electronic components.

8. The method according to claim 1, which comprises using an initiation signal which corresponds to the status signal of a last one of the electronic components for bringing about a further section of the at least one test for the electronic components.

9. The method according to claim 1, which comprises using a clock signal as a basis for initiating an outputting of the output data.

10. The method according to claim 1, which comprises using a clock signal as a basis for outputting of the output data.

11. The method according to claim 1, which comprises using, as the electronic components, one of semiconductor modules and semiconductor chips.

12. A device for testing a plurality of electronic components, comprising:
    a testing configuration for performing at least one test to be carried out on a plurality of electronic components, said testing configuration including a first line device and further line devices;
    said first line device to be connected to a first one of the electronic components and providing a primary output initiation signal to the first one of the electronic components for causing the first one of the electronic component to output first output data; and
    said further line devices being provided for further ones of the electronic components, each of said further line devices connecting a further one of the electronic components with a directly preceding one of the electronic components and each of said further line devices supplying, to a respective following one of the electronic components, an output initiation signal, which is not directly dependent on the primary output initiation signal and corresponds to a status signal of a preceding one of the electronic components, for causing the following one of the electronic components to output further output data such that output data of all of the electronic components is output to be recorded in response to the primary output initiation signal provided from said first line device.

13. The device according to claim 12, wherein:
    in each case precisely one of said further line devices is provided for each respective following one of the electronic components; and
    said one of said further line devices feeds in each case the output initiation signal, which corresponds to the status signal of a respective directly preceding one of the electronic components, to the respective following one of the electronic components for causing the respective following one of the electronic components to output the further output data.

14. The device according to claim 12, wherein said testing configuration includes an accommodation device for at least one of placing and contacting the electronic components.

15. The device according to claim 12, including a control device connected to said first line device for controlling the at least one test to be carried out on the electronic components.

16. The device according to claim 15, wherein said control device at least one of generates and outputs the primary output initiation signal to said first line device.

17. The device according to claim 15, including a status line device connected to said control device, said status line device supplying, to said control device, an initiation signal corresponding to the status signal of a last one of the electronic components for initiating one of a further test and a test section.

18. The device according to claim 12, wherein said testing configuration includes an evaluation device to be connected to the electronic components for at least recording the output data of the electronic components.

19. The device according to claim 12, wherein said testing configuration includes a clock line device to be connected to the electronic components for providing a clock signal at least to the electronic components in order to control an outputting of the output data.

20. The device according to claim 12, wherein said testing configuration includes a status line device to be connected to a last one of the electronic components, said status line device providing an initiation signal corresponding to the status signal of the last one of the electronic components for initiating one of a further test and a test section for the electronic components.

21. The device according to claim 12, including a respective flip-flop device for each of the respective following one of the electronic components, said flip-flop device being supplied with the status signal of the preceding one of the electronic components.

22. The device according to claim 21, wherein said respective flip-flop device is embodied in each case in one of said further line devices.

23. The device according to claim 12, wherein said testing configuration includes a respective flip-flop device for each of the respective following one of the electronic components, said flip-flop device is supplied with the status signal of a directly preceding one of the electronic components, and said flip-flop device generating the output initiation signal for the following one of the electronic components.

24. The device according to claim 12, including:
    flip-flop devices for the electronic components, said flip-flop devices being supplied with the status signal of a respective directly preceding one of the electronic components;
    said flip-flop devices generating the output initiation signal for the respective following one of the electronic components; and
    said flip-flop devices being embodied in each case in one of said further line devices, and said flip-flop devices together forming a shift register.

* * * * *